United States Patent [19]
Ishii et al.

[11] Patent Number: 6,134,136
[45] Date of Patent: Oct. 17, 2000

[54] SEMICONDUCTOR INTEGRATED CIRCUIT DEVICE

[75] Inventors: Kazutoshi Ishii; Sumitaka Gotou; Yasuhiro Moya; Yoshihide Kanakubo; Tatuya Kitta, all of Chiba, Japan

[73] Assignee: Seiko Instruments Inc., Japan

[21] Appl. No.: 09/236,896

[22] Filed: Jan. 26, 1999

[30] Foreign Application Priority Data

Feb. 9, 1998 [JP] Japan .................................. 10-027089

[51] Int. Cl.$^7$ ........................................................ G11C 5/02
[52] U.S. Cl. ................................................. 365/51; 365/63
[58] Field of Search .......................................... 365/51, 63

[56] References Cited

U.S. PATENT DOCUMENTS 5,807,791  9/1998  Bertin et al. .............................. 365/51
5,936,876  8/1999  Sugasawara ............................... 365/63
5,983,331  11/1999  Akamatsu et al. ......................... 365/51

*Primary Examiner*—Son T. Dinh
*Attorney, Agent, or Firm*—Adams & Wilks

[57] ABSTRACT

Reducing the chip area while improving the manufacturing efficiency as well as reducing costs in a semiconductor integrated circuit device such as a thermal head driver IC. A plurality of terminal electrodes were provided within an external data input/output circuit with an input terminal and output terminal being electrically connected to each other. In addition, an input/output protection circuit was provided to a respective one of such plurality of terminal electrodes with the input terminal and output terminal electrically connected together.

8 Claims, 4 Drawing Sheets

SEMICONDUCTOR INTEGRATED CIRCUIT DEVICE

BACKGROUND OF THE INVENTION

The present invention relates to semiconductor integrated circuit devices for use in driving liquid crystal of liquid crystal display panels and also with thermal head printers as well as for use in driving stepping motors of quartz clocks.

The present invention relates to semiconductor integrated circuits of the insulated gate field effect transistor type with high withstanding/breakdown voltage structures, and more particularly to driver ICs such as ones for use in driving liquid crystals and driving the thermal sensitive paper resistivity or the like.

It also relates to semiconductor integrated circuit devices with built-in protective circuitry for protection of internal elements or components.

Especially preferably, it relates to semiconductor integrated circuits with a chip side length being extremely greater relative to the chip area, such as a semiconductor integrated circuit for use in driving a thermal head.

Prior known semiconductor devices for thermal heads (referred to as "T/H-ICs" hereinafter) are typically arranged to have switching functions of permitting current to flow in a plurality of resistors as linearly arrayed along a sheet of heat-sensitive paper in a way conformity with information to be printed. Data signals and control signals are transferred by electrically connecting external connection terminal electrodes for logical signals which are provided on the surface of a T/H-IC. In most cases a plurality of such T/H-ICs are used on the same ceramic substrate. When this is done, in order to eliminate phase shift or deviation otherwise occurring between neighboring ones of the T/H-ICs, data signals are sent forth by cascade connection among the T/H-ICs. On the other hand, in order to prevent phase deviation from occurring between the initial stage T/H-IC and the final stage T/H-IC, no cascade connection is used for control signals. In addition, an output signal for resistor drive is transferred by electrically connecting together a resistor-driving external connection terminal electrode provided on the surface of a semiconductor device and a resistive body on the same ceramic substrate.

In the prior art semiconductor devices for use with thermal heads (semiconductor integrated circuits), ceramic substrates have been employed which are significant in area ratio of lead wire regions on the surface thereof with production costs increased.

SUMMARY OF THE INVENTION

Then, in order to avoid the problems faced with the prior art, the present invention makes use of the following means.

In a semiconductor integrated circuit device as composed of those circuits formed from a plurality of insulated gate field effect transistors including an external data input/output circuit, an external data input circuit, a data external output circuit, an input/output protection circuit, an internal data transfer circuit and data storage circuit, and also a data external output circuit formed from more than one high withstanding voltage insulated gate field effect transistor, a plurality of terminal electrodes having an input terminal and an output terminal being electrically connected to each other is provided in the external data input/output circuit.

The input/output protection circuit is provided to a respective one of the terminal electrodes with the input terminal and the output terminal being electrically connected together.

In the case the input terminal and the output terminal are electrically connected together by use of a metal lead wire layer at low resistivity, a single input/output protection circuit is provided to the plurality of terminal electrodes.

The metal lead wire layer for electrically connecting the input terminal and output terminal at low resistivity is provided to have its lead width which may range from 1 micrometers to 10 micrometers.

The metal lead wire layer for electrically connecting the input terminal and the output terminal at low resistivity is provided to have a lead film width that may range from 0.5 micrometers to 3 micrometers.

The input/output protection circuit is provided between the terminal electrode and the external data input circuit.

The input/output protection circuit is provided between the terminal electrode and the data external output circuit.

As stated above, since the plural terminal electrodes are provided within the external data input/output circuit with the input terminal and output terminal being electrically connected together, it becomes possible to achieve cascade connection of a control signal, which may in turn enable provision of a thermal print head structure using small-size ceramic substrate.

Further, since the input/output protection circuits was provided for a respective one of the plurality of terminal electrodes with input and output terminals being electrically connected together, it was possible to provide a semiconductor device for thermal heads with enhanced reliability.

Furthermore, where the input terminal and output terminal are electrically connected together by use of a metal lead wire layer at low resistivity, since a single input/output protection circuit is provided to the plurality of terminal electrodes, it has been possible to accomplish provision of a semiconductor device for small-size thermal heads.

Furthermore, since the metal lead wire layer for electrically connecting the input terminal and the output terminal at low resistivity is provided to have its lead width ranging from 1 micrometers to 10 micrometers, it is possible to realize provision of a semiconductor device for small-size thermal heads with increased reliability.

Moreover, since the metal lead wire layer for electrically connecting the input terminal and the output terminal at low resistivity is provided to have its lead film width ranging from 0.5 micrometers to 3 micrometers, it becomes possible to achieve provision of a semiconductor device for small-size thermal heads with high reliability.

In addition, since the input/output protection circuit is provided between the terminal electrodes and the external data input circuit while providing the input/output protection circuit between the terminal electrodes and data external output circuit, it is possible to attain provision of a semiconductor device for small-size thermal heads of high reliability.

DETAILED DESCRIPTION

Some preferred embodiments of this invention will be explained on the basis of the accompanying drawings.

A semiconductor device for use with thermal heads in accordance with the present invention is configured to have a switch function for letting a current flow into a plurality of resistors as linearly arrayed along a thermal sensitive paper sheet in a way such that the intensity is in conformity with information being printed. A data signal and a control signal are transferred by electrically connecting to the outside an external connection terminal electrode for logic signals as provided on the surface of the semiconductor device for thermal heads. In the present invention a plurality of similar semiconductor devices for thermal heads are employed on the same ceramic substrate. At this time, in order to eliminate any possible phase shift or deviation between neighboring ones of the thermal-head semiconductor devices, a specific configuration is employed causing the data signal to be transferred via a cascade connection among the thermal-head semiconductor devices used. On the other hand, although no such cascade connection is used for transmission of the control signal in view of the fact that phase deviation can generally take place between the initial stage and the final stage of such thermal-head semiconductor devices, the present invention is specifically arranged so that the control signal also is sent forth by a cascade connection among the thermal-head semiconductor devices. Additionally, an output signal for resistor drive is transferred by electrically connecting a resistor-driving external connection terminal electrode provided on the surface of a semiconductor device to a resistive body on the same ceramic substrate.

Figure 1:
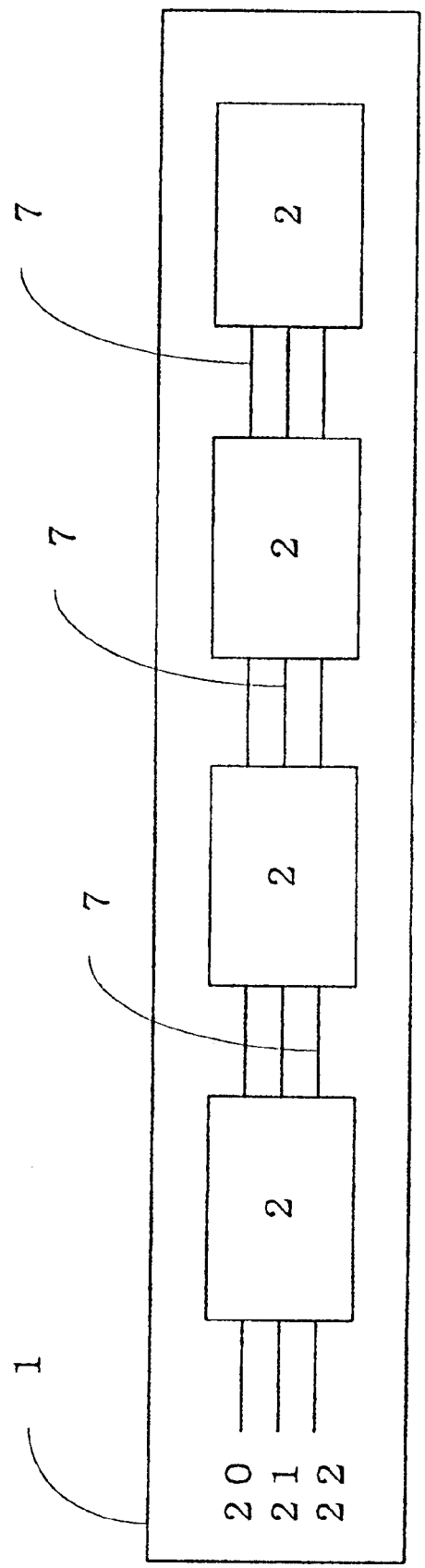
FIG. 1 is a schematical plan view diagram in the case where a plurality of semiconductor devices for use as thermal head drivers in accordance with the present invention are mounted on a thermal head.
Figure 2:
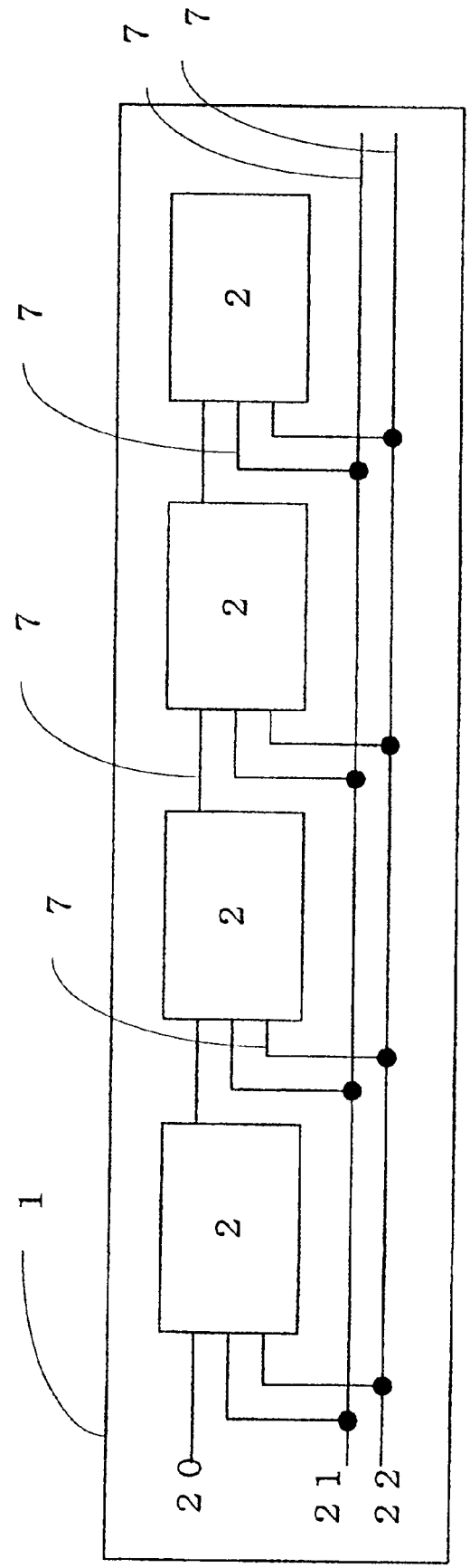
FIG. 2 is a schematical plan view diagram in the case a plurality of prior art semiconductor devices for use as thermal head drivers are mounted on a thermal head.

FIG. 1 is a schematic plan view in the case a plurality of thermal-head driver semiconductor devices 2 are mounted on a thermal head. A necessary number of such thermal-head driver semiconductor devices 2 are mounted on a ceramic substrate 1, which number is determinable depending upon the print size required. This mount method may include two principal cases: bonding the bottom surface of a semiconductor device 2 to the ceramic substrate 1, and bonding terminal electrodes on the top surface of the semiconductor device 2 to a lead wire layer 7 on the ceramic substrate 1. In the case where the bottom surface of semiconductor device 2 is bonded to the ceramic substrate 1, lead wire layers 7 on the ceramic substrate 1 are electrically connected by wire bonding techniques to the terminal electrodes on the surface of each semiconductor device 2 after completion of the bonding attachment. Alternatively, in the case the terminal electrodes on the top surface of semiconductor device 2 are bonded to lead wire layers 7 on ceramic substrate 1, certain projections such as soldering bumps are provided on the terminal electrodes on the surface of semiconductor device 2 for bonding together the lead wire layers 7 on the ceramic substrate 1 and the soldering bumps on the terminal electrodes on the surface of a semiconductor device 2 while at the same time electrically connecting them together.

A data signal 20 and control signals 21, 22 or the like are electrically coupled through respective semiconductor devices 2 by the lead wire layers 7 on the ceramic substrate 1. In this case, in order to suppress or eliminate any possible phase shift or deviation between the initial stage and the final stage in the control signals 21, 22 of the thermal-head semiconductor devices 2, several methods are available, including a method of providing a low-resistivity lead wire within a thermal-head semiconductor device 2, a method of adjusting the phase of the individual one of the data signal and control signal in response to an output of each thermal-head semiconductor device 2.

Figure 3:
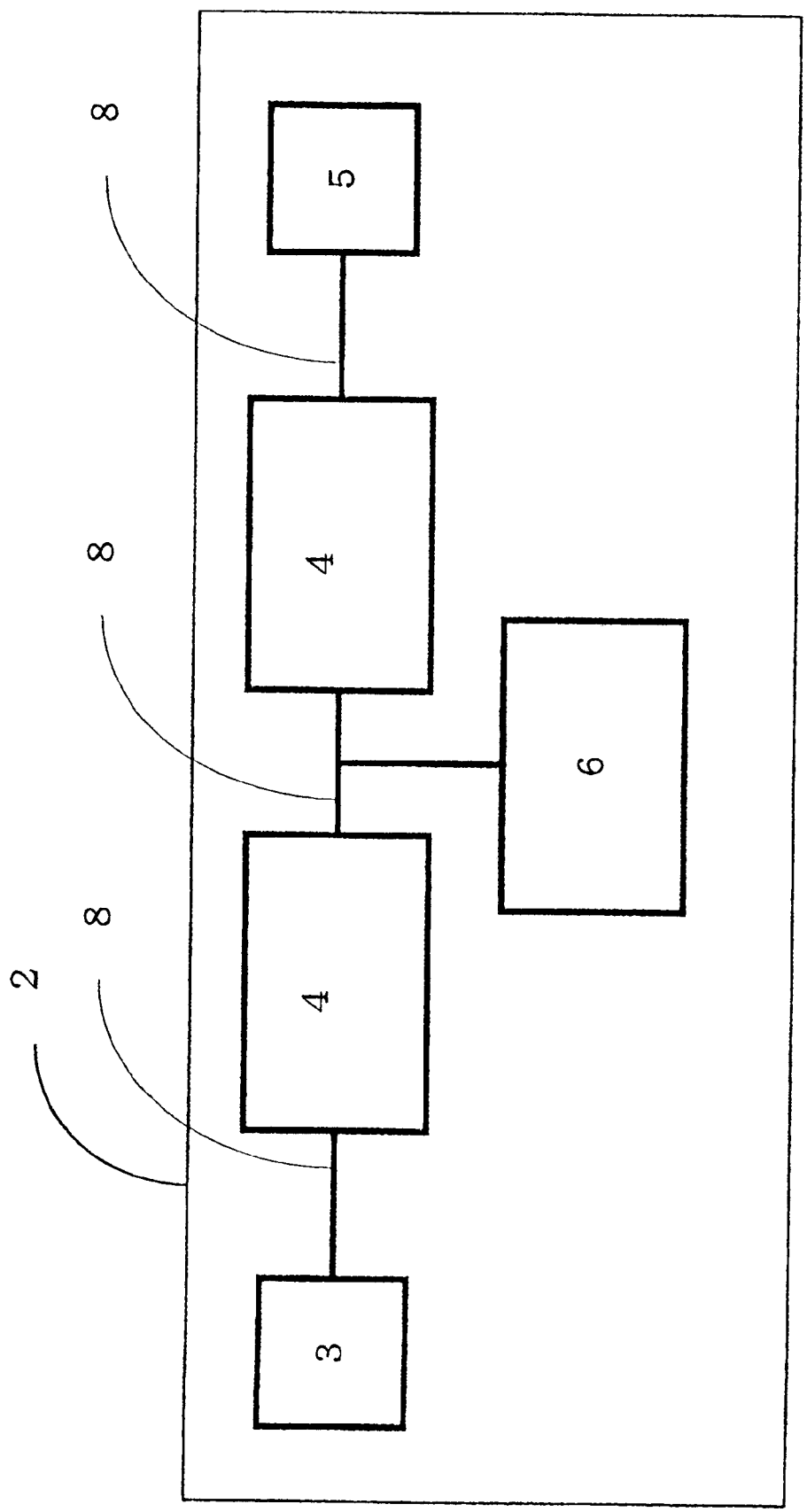
FIG. 3 is a schematical diagram of a circuit configuration of a semiconductor device for use as a thermal head driver in accordance with the-present invention.

FIG. 3 is a schematic diagram showing a circuit configuration of the thermal-head driver semiconductor device 2 embodying the present invention. An input terminal electrode 3 for external connection as provided near the surface of the thermal-head driver semiconductor device 2 is electrically connected via a lead wire layer 8 to an input/output protection circuit 4, while the input/output protection circuit 4 and an internal circuit 6 are electrically connected to each other via a lead wire layer 8. Similarly, an output terminal electrode 5 for external connection is electrically connected through a lead wire layer 8 to the input/output protection circuit 4 while permitting the input/output protection circuit 4 and the internal circuit 6 to be electrically connected together via the lead wire layer 8. At this time, when metal lead wires are used for both the lead wire layer 8 connecting together the input terminal electrode 3 and input/output protection circuit 4 and the lead wire layer 8 for connection of the output terminal electrode 5 and input/output protection circuit 4, the reliability against attendant electrostatic stress as externally applied thereto may be improved.

Figure 4:
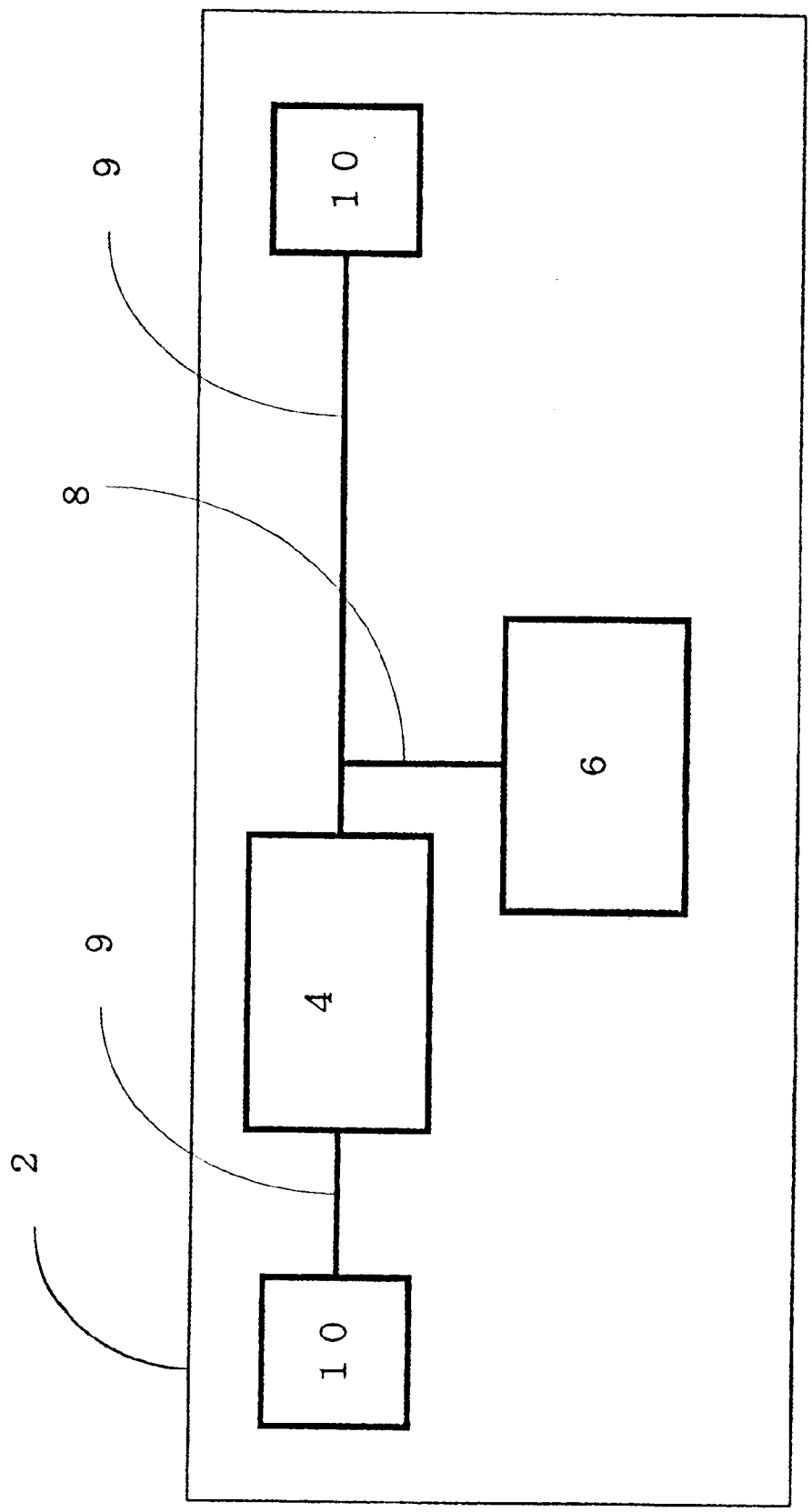
FIG. 4 is a schematical diagram of a circuit configuration of a semiconductor device for use as a thermal head driver in accordance with the present invention.

FIG. 4 is a schematic diagram showing a circuit configuration of a thermal-head driver semiconductor device 2 also embodying the present invention. A plurality of input/output terminal electrodes 10 for external connection as provided near the surface of the thermal-head driver semiconductor device 2 are electrically connected via a metal lead wire layer 9 to an input/output protection circuit 4, whist an internal circuit 6 is connected via a lead wire layer 8 to a metal lead wire layer 9 that is for connecting between the input/output protection circuit 4 and any given input/output terminal electrode 10. In this case, in light of the fact that the input/output terminal electrode 10 and the input/output protection circuit 4 are electrically connected together by the metal lead wire layer 9 at low resistivity, the input/output protection circuit 4 advantageously functions to absorb any electrostatic stress as externally applied to the input/output terminal electrode 10 to thereby ensure that no stress is applied to the internal circuit 6. Due to this, high reliability is achievable even when the input/output protection circuit 4 is provided to occupy a half-reduced area as compared to the prior art. In addition, while it would be optimal that the resistance value of the metal lead wire layer 9 used at this time is about 300 Ohms or less, the intended concept remains attainable even when the resistance value is at 500 Ohms or less; further, acceptable reliability is still expectable even when the value is less than or equal to 1,000 Ohms. Furthermore, while it is preferable that the line width of the metal lead wire layer 9 be of from 4 to 10 micrometers or therearound, the achievability remains even when it ranges from 2 to 4 micrometers, or more or less. Still further, the film thickness of the metal lead wire layer 9 is preferably in a range of from 0.5 to 3 micrometers in the case of aluminum compound.

As has been described above, this invention is drawn to a thermal-head driver semiconductor device capable of achieving interconnection of control signal lines by the cascade connection scheme, which may lead to capabilities of reducing the head area of a thermal head used and also the semiconductor device chip area to thereby reduce production costs thereof.

What is claimed is:

1. A semiconductor integrated circuit device as configured from circuits formed from a plurality of insulated gate field effect transistors including an external data input/output circuit, an external data input circuit, a data external output circuit, an input/output protection circuit, an internal data transfer circuit, and data storage circuit, and also from a data external output circuit formed from more than one high withstanding voltage insulated gate field effect transistor, characterized in that a plurality of terminal electrodes having an input terminal and an output terminal being electrically connected to each other are provided in said external data input/output circuit.

2. The semiconductor integrated circuit device according to claim 1, characterized in that said input/output protection circuit is provided to a respective one of said terminal electrodes with said input terminal and said output terminal being electrically connected together.

3. The semiconductor integrated circuit device according to claim 1, characterized in that a single one of said input/output protection circuit is provided to said plurality of terminal electrodes with said input terminal and said output terminal being electrically connected together by use of a metal lead wire layer at low resistivity.

4. The semiconductor integrated circuit device according to claim 3, characterized in that said metal lead wire layer for electrically connecting together said input terminal and said output terminal at low resistivity is provided to have its lead width ranging from 2 micrometers to 4 micrometers.

5. The semiconductor integrated circuit device according to claim 3, characterized in that said metal lead wire layer for electrically connecting together said input terminal and said output terminal at low resistivity is provided to have its lead film width ranging from 0.5 micrometers to 3 micrometers.

6. The semiconductor integrated circuit device according to claim 2, characterized in that said input/output protection circuit is provided between said terminal electrode and said external data input circuit.

7. The semiconductor integrated circuit device according to claim 2, characterized in that said input/output protection circuit is provided between said terminal electrode and said data external output circuit.

8. The semiconductor integrated circuit device according to claim 3, characterized in that said metal lead wire layer for electrically connecting together said input terminal and said output terminal at low resistivity is provided to have a resistance value of 300 Ohms or less.

* * * * *